United States Patent

Liu

[11] Patent Number: 5,866,474
[45] Date of Patent: Feb. 2, 1999

[54] METHOD FOR MANUFACTURING GATE OXIDE LAYERS

[75] Inventor: Yi-Chih Liu, Hsinchu, Taiwan

[73] Assignee: United Microelectronics Corp., Taiwan

[21] Appl. No.: 926,975

[22] Filed: Sep. 10, 1997

[30] Foreign Application Priority Data

Jul. 17, 1997 [TW] Taiwan ................................. 86110122

[51] Int. Cl.$^6$ ...................... H01L 21/3205; H01L 21/461
[52] U.S. Cl. ............................................. 438/591; 438/762
[58] Field of Search ................................... 438/591, 593, 438/762, 763

[56] References Cited

U.S. PATENT DOCUMENTS

| | | | |
|---|---|---|---|
| 5,258,333 | 11/1993 | Shappir et al. | 437/235 |
| 5,407,870 | 4/1995 | Okada et al. | 437/241 |
| 5,464,792 | 11/1995 | Tseng et al. | 437/160 |
| 5,571,734 | 11/1996 | Tseng et al. | 437/40 |
| 5,624,868 | 4/1997 | Iyer | 438/762 |
| 5,650,344 | 7/1997 | Ito et al. | 437/40 |
| 5,661,072 | 8/1997 | Jeng | 438/439 |
| 5,712,177 | 1/1998 | Kaushik et al. | 437/42 |
| 5,726,087 | 3/1998 | Tseng et al. | 438/261 |

*Primary Examiner*—John F. Niebling
*Assistant Examiner*—Michael S. Lebentritt
*Attorney, Agent, or Firm*—Rabin & Champagne, P.C.

[57] ABSTRACT

A method for forming gate oxide layers comprising the steps of providing a silicon substrate; forming a first oxide layer on the substrate; forming a first barrier layer at an interface between the first oxide layer and the substrate; forming a second oxide layer at an interface between the first barrier layer and the substrate; forming a second barrier layer at an interface between the second oxide layer and the substrate; and forming a third oxide layer at an interface between the second barrier layer and the substrate. One of the main characteristics of the invention is that of forming a first barrier layer between the first oxide layer and the second oxide layer, and forming a second barrier layer between the second oxide layer and the third oxide layer. As a result, the present invention is capable of increasing the breakdown voltage, minimising the tunneling effect and decreasing the amount of trapped oxide charges in a gate oxide layer.

12 Claims, 3 Drawing Sheets

METHOD FOR MANUFACTURING GATE OXIDE LAYERS

BACKGROUND OF THE INVENTION

1. Field of Invention

The present invention relates to a method for manufacturing semiconductors. More particularly, the present invention relates to the method for manufacturing gate oxide layers which have a high breakdown voltage, a low tunneling effect and a low oxide trapped charges.

2. Description of Related Art

In the manufacture of semiconductors, the quality of a gate oxide layer has significant effects on the electrical properties of a metal oxide semiconductor transistor. Excessive amounts of defects, impurities or charges in the gate oxide layer can bring down the breakdown voltage and shorten the time-dependent dielectric breakdown (TDDB) time. As a result, the reliability and lifetime of a metal oxide semiconductor transistor is shortened. Therefore, caution must be exercised during the manufacture of the gate oxide layer so that proper electrical characteristics are kept. Several sources contribute to the charges that affect the electrical properties of a gate oxide layer, they are: (1) differences in interfacial states; (2) fixed oxide charges in an oxide layer; (3) mobile ionic charges; and (4) oxide trapped charges. The oxide trapped charges are formed in places where electrons or holes are trapped by impurities or unsaturated bonds within the gate oxide layer during manufacturing. Therefore, the oxide trapped charges are distributed randomly. At present, methods to increase the breakdown voltage, minimise the tunneling effect and decrease the oxide trapped charges of a gate oxide layer are still major research topics.

FIGS. 1A and 1B are cross-sectional views showing the progression of manufacturing steps in the production of a gate oxide layer according to a conventional method.

As shown in FIG. 1A, a silicon substrate 10 is first provided. The substrate 10 is placed inside an oxidation furnace, and then oxygen is passed. Next, a preoxidation process is performed by heating the furnace to a temperature of about 750°–850° C. to form a first oxide layer 11 on the substrate 10. Thereafter, the substrate 10 is placed inside an oxidation furnace, and then either nitrous oxide or nitric oxide is passed. In a subsequent step, heating is carried out at a temperature of about 750°–850° C. to form a barrier layer 12 at the interface between the first oxide layer 11 and the substrate 10. The barrier layer 12 can be an oxynitride layer.

Next, in FIG. 1B, the substrate 10 is once again placed inside an oxidation furnace and oxygen is passed. Then, a reoxidation process is carried out at a temperature of about 750°–850° C. to form a second oxide layer 13 at the interface between the barrier layer 12 and the substrate 10.

Finally, subsequent conventional processes for the complete formation of a gate oxide layer are performed. Because the conventional processes are familiar to those skilled in the art, detailed descriptions are omitted here.

The above conventional method of forming a barrier layer 12 between the first oxide layer 11 and the second oxide layer 13 is not too effective in increasing the breakdown voltage, minimising the tunneling effect and decreasing the amount of trapped oxide charges. In light of the foregoing, there is a need in the art for improving method of forming a gate oxide layer.

SUMMARY OF THE INVENTION

Accordingly, the present invention is directed to a method of forming a gate oxide layer having high breakdown voltage, minimal tunneling effect and few trapped oxide charges.

To achieve these and other advantages and in accordance with the purpose of the invention, as embodied and broadly described herein, the invention includes a method of forming a gate oxide layer which comprises the steps of providing a silicon substrate; forming a first oxide layer on the substrate; forming a first barrier layer at an interface between the first oxide layer and the substrate; forming a second oxide layer at an interface between the first barrier layer and the substrate; forming a second barrier layer at an interface between the second oxide layer and the substrate; and forming a third oxide layer at an interface between the second barrier layer and the substrate.

It is preferred that the steps of forming the first oxide layer, the second oxide layer and the third oxide layer include placing the substrate in an oxidation furnace, then passing oxygen into the furnace and heating to a temperature of about 750°–850° C. Preferably, the steps of forming the first barrier layer and the second barrier layer include placing the substrate in an oxidation furnace, passing ammonia or nitric oxide or nitrous oxide into the furnace and heating to a temperature of about 750°–850° C.

One of the main characteristics of the invention is that of forming a first barrier layer between the first oxide layer and the second oxide layer, and forming a second barrier layer between the second oxide layer and the third oxide layer. Therefore, the present invention is capable of increasing the breakdown voltage, minimising the tunneling effect and decreasing the amount of trapped oxide charges in a gate oxide layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
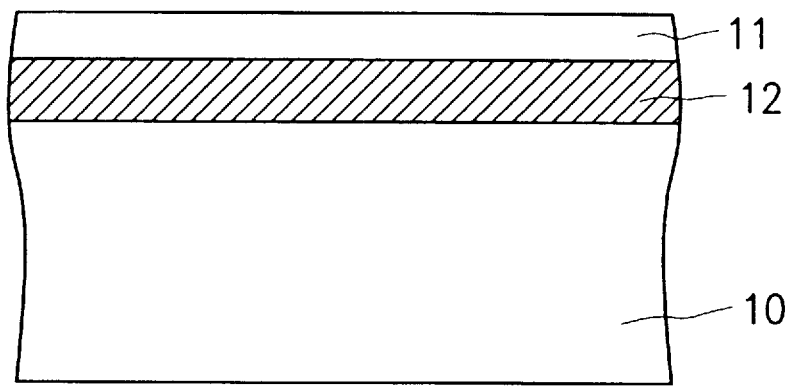
FIGS. 1A and 1B are cross-sectional views showing the progression of manufacturing steps in the production of a gate oxide layer according to a conventional method.
Figure 1B:
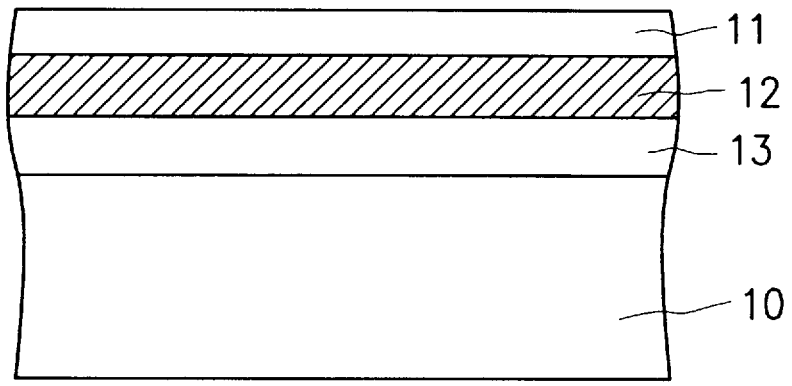

Reference will now be made in detail to the present preferred embodiments of the invention, examples of which are illustrated in the accompanying drawings. Wherever possible, the same reference numbers are used in the drawings and the description to refer to the same or like parts.

Figure 2A:
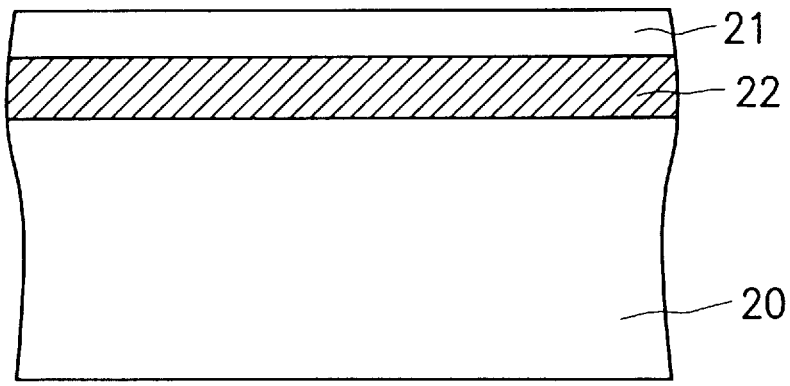
FIGS. 2A and 2D are cross-sectional views showing the progression of manufacturing steps in the production of a gate oxide layer according to the preferred embodiments of the invention.

In accordance with the invention, there is provided a method of forming a gate oxide layer. FIGS. 2A and 2D are cross-sectional views showing the progression of manufacturing steps in the production of a gate oxide layer according to the preferred embodiments of the invention. As shown in FIG. 2A, a silicon substrate 20 is first provided. The substrate 20 is placed inside an oxidation furnace, and then oxygen is passed. Next, a preoxidation process is performed by heating the furnace to a temperature of about 750°–850°

C. to form a first oxide layer 21 on the substrate 20. Thereafter, the substrate 20 is placed inside an oxidation furnace, and then either ammonia or nitrous oxide or nitric oxide is passed into the furnace. In a subsequent step, heating is carried out at a temperature of about 750°–850° C. to form a first barrier layer 22 at the interface between the first oxide layer 21 and the substrate 20. The first barrier layer 22 can be an oxynitride layer.

Figure 2B:
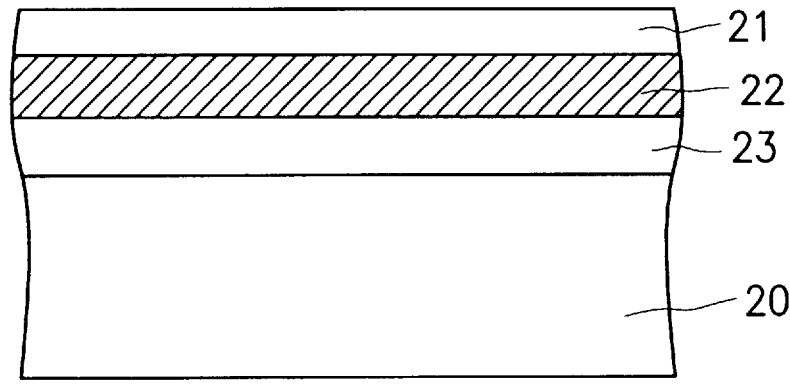

Next, in FIG. 2B, the substrate 20 is once again placed inside an oxidation furnace and then oxygen is passed. Then, a reoxidation process is carried out at a temperature of about 750°–850° C. to form a second oxide layer 23 at the interface between the first barrier layer 22 and the substrate 20.

Figure 2C:
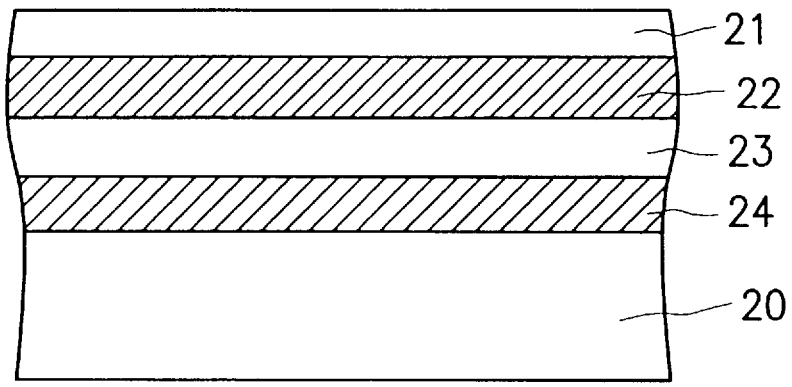
Figure 2D:
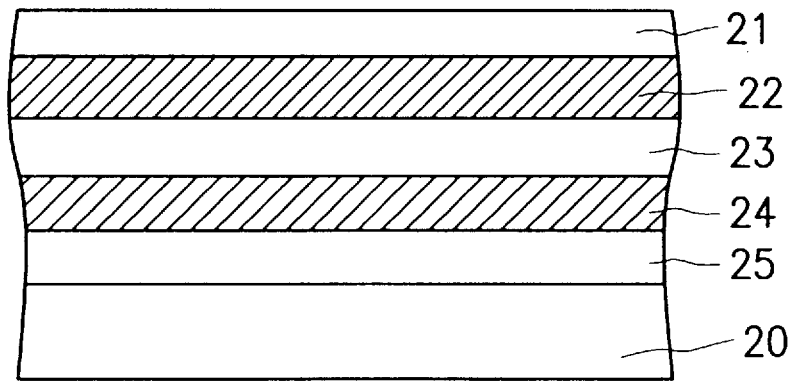

Next, in FIG. 2C, the substrate 20 is placed inside an oxidation furnace, and then either ammonia or nitrous oxide or nitric oxide is passed into the furnace. In a subsequent step, heating is carried out at a temperature of about 750°–850° C. to form a second barrier layer 24 at the interface between the second oxide layer 23 and the substrate 20. The second barrier layer 24 can be an oxynitride layer.

Thereafter, in FIG. 2D, the substrate 20 is placed inside an oxidation furnace and then oxygen is passed. Then, a reoxidation process is carried out at a temperature of about 750°–850° C. to form a third oxide layer 25 at the interface between the second barrier layer 24 and the substrate 20.

Finally, subsequent conventional processes for the complete formation of a gate oxide layer are performed. Because the conventional processes are familiar to those skilled in the art, detailed descriptions are omitted here.

One of the main characteristics of the invention is that of forming a first barrier layer between the first oxide layer and the second oxide layer, and forming a second barrier layer between the second oxide layer and the third oxide layer. As a result, the present invention is capable of increasing the breakdown voltage, minimising the tunneling effect and decreasing the amount of trapped oxide charges in a gate oxide layer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing gate oxide layers comprising the steps of:

providing a silicon substrate;

forming a first oxide layer on the substrate surface;

forming a first barrier layer at an interface between the first oxide layer and the substrate;

forming a second oxide layer at an interface between the first barrier layer and the substrate;

forming a second barrier layer at an interface between the second oxide layer and the substrate; and forming a third oxide layer at an interface between the second barrier layer and the substrate.

2. The method of claim 1, wherein the step of forming the first oxide layer includes placing the substrate in a furnace, passing in oxygen and heating to a temperature of about 750°–850° C.

3. The method of claim 1, wherein the step of forming the first barrier layer includes placing the substrate in a furnace, passing in ammonia and heating to a temperature of about 750°–850° C.

4. The method of claim 1, wherein the step of forming the first barrier layer includes placing the substrate in a furnace, passing in nitric oxide and heating to a temperature of about 750°–850° C.

5. The method of claim 1, wherein the step of forming the first barrier layer includes placing the substrate in a furnace, passing in nitrous oxide and heating to a temperature of about 750°–850° C.

6. The method of claim 1, wherein the step of forming the second oxide layer includes placing the substrate in a furnace, passing in oxygen and heating to a temperature of about 750°–850° C.

7. The method of claim 1, wherein the step of forming the second barrier layer includes placing the substrate in a furnace, passing in ammonia and heating to a temperature of about 750°–850° C.

8. The method of claim 1, wherein the step of forming the second barrier layer includes placing the substrate in a furnace, passing in nitric oxide and heating to a temperature of about 750°–850° C.

9. The method of claim 1, wherein the step of forming the second barrier layer includes placing the substrate in a furnace, passing in nitrous oxide and heating to a temperature of about 750°–850° C.

10. The method of claim 1, wherein the step of forming the third oxide layer includes placing the substrate in a furnace, passing in oxygen and heating to a temperature of about 750°–850° C.

11. The method of claim 1, wherein the step of forming the first barrier layer includes providing an oxynitride layer.

12. The method of claim 1, wherein the step of forming the second barrier layer includes providing an oxynitride layer.

* * * * *